(12) United States Patent
Hong

(10) Patent No.: US 12,726,118 B2
(45) Date of Patent: Sep. 1, 2026

(54) SWITCHED-CAPACITOR CIRCUIT AND PIPELINED ANALOG-TO-DIGITAL CONVERTOR INCLUDING THE SAME

(71) Applicant: Realtek Semiconductor Corporation, Hsinchu (TW)

(72) Inventor: Wei-Cian Hong, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 177 days.

(21) Appl. No.: 18/755,688

(22) Filed: Jun. 27, 2024

(65) Prior Publication Data

US 2025/0007396 A1 Jan. 2, 2025

(30) Foreign Application Priority Data

Jun. 30, 2023 (TW) ................................ 112124525

(51) Int. Cl.
*H03M 1/00* (2006.01)
*H02M 3/07* (2006.01)
*H03M 1/12* (2006.01)

(52) U.S. Cl.
CPC ............... *H02M 3/07* (2013.01); *H03M 1/12* (2013.01)

(58) Field of Classification Search
CPC .... H03M 1/164; H03M 1/167; H03M 1/0607; H03M 1/12; H03M 1/1245; H03M 1/38; H03M 1/442; H03M 1/46; H03M 1/468; H03M 1/66; H03M 1/06; H03M 1/145; H03M 1/168; H03M 1/361; H03M 1/50; H03M 1/54; H03M 3/456; H03M 1/001; H03M 1/002; H03M 1/0604; H03M 1/0612; H03M 1/0656; H03M 1/0695; H03M 1/0845; H03M 1/0854; H03M 1/1023; H03M 1/121; H03M 1/16; H03M 1/183; H03M 1/201; H03M 1/403; H03M 1/52; H03M 1/56; H03M 1/60; H03M 1/662; H03M 1/802; H03M 1/804; H03M 3/342; H03M 3/356; H03M 3/37; H03M 3/39; H03M 3/422; H03M 3/426; H03M 3/43; H03M 3/434; H03M 3/464; H03M 3/47
USPC ........ 341/155, 161, 162, 172, 144, 118, 120
See application file for complete search history.

(56) References Cited

U.S. PATENT DOCUMENTS

| | | | | |
|---|---|---|---|---|
| 9,483,028 | B1 * | 11/2016 | Kinyua | H03M 1/124 |
| 10,128,859 | B1 * | 11/2018 | Rajasekhar | H03M 1/0607 |
| 10,826,519 | B1 * | 11/2020 | Hurrell | H03F 3/45475 |
| 2004/0046605 | A1 | 3/2004 | Granville | |
| 2007/0285299 | A1 * | 12/2007 | Krishnan | H03M 1/0607 341/155 |

(Continued)

*Primary Examiner* — Linh V Nguyen
(74) *Attorney, Agent, or Firm* — CKC & Partners Co., LLC

(57) ABSTRACT

A switched-capacitor circuit includes a sampling capacitor array, a control circuit, and a charge-transfer circuit. The sampling capacitor array is configured to sample an input voltage in a sampling phase. The control circuit is configured to determine magnitude of a preset voltage according to the input voltage, and configured to adjust the input voltage sampled by the sampling capacitor array in a preset phase according to magnitude of the input voltage to generate an adjusted voltage. The charge-transfer circuit is configured to amplify the adjusted voltage in a charge-transfer phase to generate an output voltage at an output terminal, and configured to provide the preset voltage to the output terminal in the preset phase.

13 Claims, 8 Drawing Sheets

(56) References Cited

U.S. PATENT DOCUMENTS

| | | | | |
|---|---|---|---|---|
| 2014/0132438 | A1* | 5/2014 | Shen | H03M 1/442 341/172 |
| 2015/0263757 | A1* | 9/2015 | Joish | H03M 1/12 341/122 |
| 2017/0237268 | A1* | 8/2017 | Brannick | H03M 1/201 378/91 |
| 2019/0165800 | A1* | 5/2019 | Chen | H03M 1/001 |
| 2020/0195137 | A1* | 6/2020 | Wang | H02M 1/36 |
| 2021/0044301 | A1* | 2/2021 | Weng | H03M 1/802 |
| 2023/0012330 | A1* | 1/2023 | Michel | H03F 3/005 |

* cited by examiner

SWITCHED-CAPACITOR CIRCUIT AND PIPELINED ANALOG-TO-DIGITAL CONVERTOR INCLUDING THE SAME

CROSS-REFERENCE TO RELATED APPLICATIONS

This application claims priority to Taiwan Application Serial Number 112124525, filed on Jun. 30, 2023, which is herein incorporated by reference in its entirety.

BACKGROUND

Technical Field

The present disclosure relates to a switched-capacitor circuit and a pipelined ADC comprising the same. More particularly, the present disclosure relates to a switched-capacitor circuit and a pipelined analog-to-digital converter (ADC) comprising the same capable of adjusting a preset voltage.

Description of Related Art

The operation of a switched-capacitor circuit can be roughly divided into a sampling phase and a charge-transfer phase. In the sampling phase, the switched-capacitor circuit uses a capacitor to store a difference between an input voltage and a common voltage. Then, in the charge-transfer phase, the switched-capacitor circuit uses a charge pump generate a corresponding output voltage at an output terminal according to a sampling result. Before the charge-transfer phase, a preset voltage is used to reset the output terminal, so as to erase the output voltage in the previous operation. In prior arts, the preset voltage has a fixed value. However, there is a larger difference between a fixed preset voltage and a target value of the output voltage, and the charge pump needs a longer time to adjust the output voltage to the target value, and thus limits the operating speed of the switched-capacitor circuit.

SUMMARY

The present disclosure provides a switched-capacitor circuit including a first sampling capacitor array, a control circuit, and a charge-transfer circuit. The first sampling capacitor array is configured to sample a first input voltage in a sampling phase. The control circuit is configured to determine magnitude of a first preset voltage according to the first input voltage, and configured to adjust the first input voltage sampled by the first sampling capacitor array in a preset phase according to magnitude of the first input voltage, so as to generate a first adjusted voltage. The charge-transfer circuit is configured to amplify the first adjusted voltage in a charge-transfer phase, so as to generate a first output voltage at a first output terminal, and configured to provide the first preset voltage to the first output terminal in the preset phase.

The present disclosure provides a switched-capacitor circuit including a first sampling capacitor array, a control circuit, and a charge-transfer circuit. The first sampling capacitor array is configured to sample a first input voltage in a sampling phase. The control circuit, configured to determine magnitude of a first reference voltage and magnitude of a first preset voltage according to a relationship between the first input voltage and a plurality of voltage thresholds, and configured to couple the first reference voltage to the first input voltage sampled by the first sampling capacitor array in a preset phase, so as to generate a first adjusted voltage. The charge-transfer circuit is configured to amplify the first adjusted voltage in a charge-transfer phase, so as to generate a first output voltage at a first output terminal, and configured provide the first preset voltage to the first output terminal in the preset phase.

The present disclosure provides a pipelined ADC including a plurality of converter circuit systems, where each converter circuit system includes a first sampling capacitor array, a control circuit, and a charge-transfer circuit. The first sampling capacitor array is configured to sample a first input voltage in a sampling phase. The control circuit is configured to determine magnitude of a first preset voltage according to the first input voltage, and configured to adjust the first input voltage sampled by the first sampling capacitor array in a preset phase according to magnitude of the first input voltage, so as to generate a first adjusted voltage. The charge-transfer circuit is configured to amplify the first adjusted voltage in a charge-transfer phase, so as to generate a first output voltage at a first output terminal, and configured to provide the first preset voltage to the first output terminal in the preset phase.

One of advantages of the aforementioned switched-capacitor circuit and pipelined ADC is their high operating speed.

DETAILED DESCRIPTION

Figure 1:
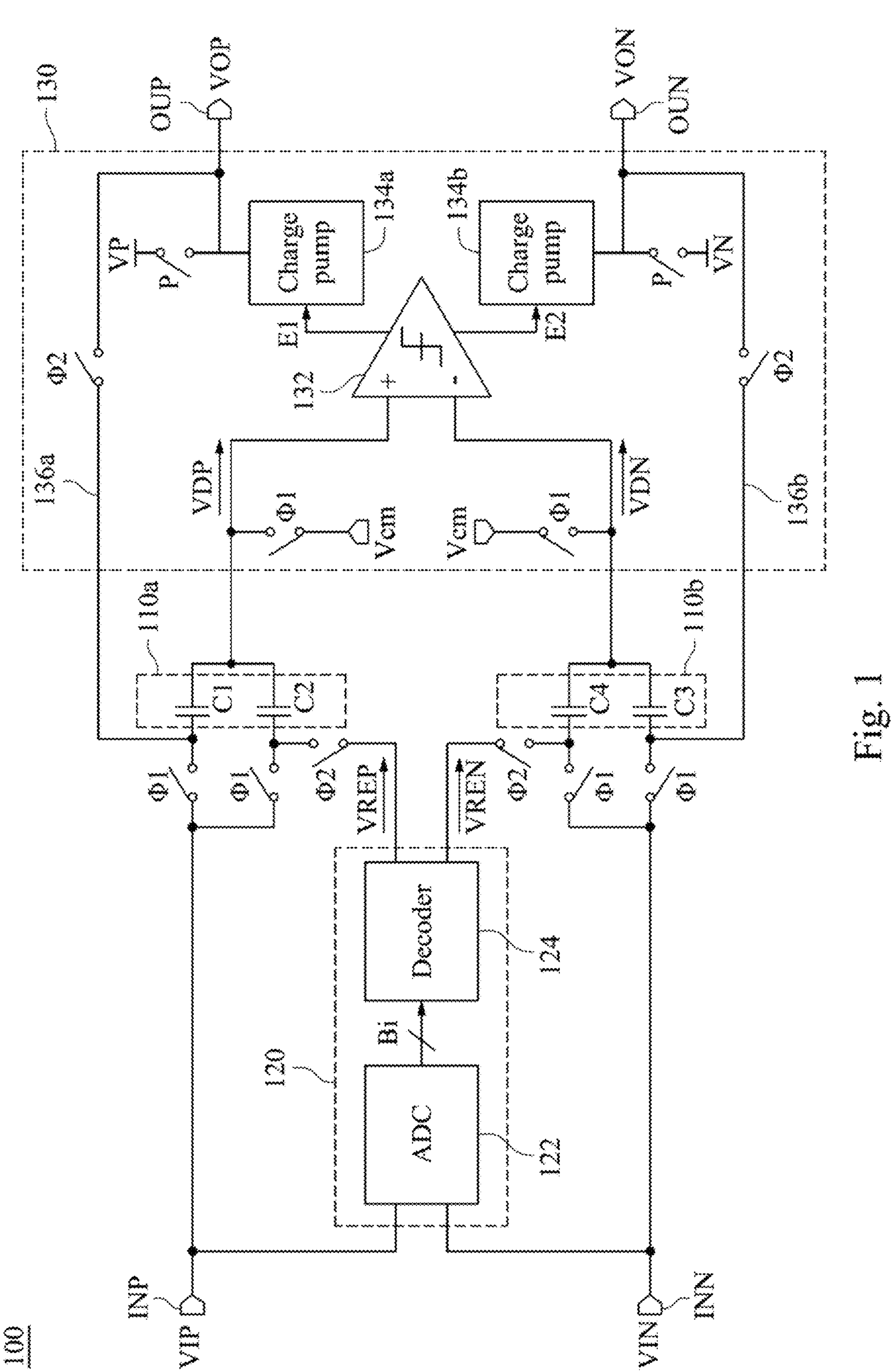
FIG. 1 is a simplified functional diagram of a switched-capacitor circuit according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional diagram of a switched-capacitor circuit 100 according to one embodiment of the present disclosure. In some embodiments, the switched-capacitor circuit 100 can be used as one of a plurality of stages of a pipelined analog-to-digital converter (ADC). The switched-capacitor circuit 100 comprises a plurality of sampling capacitor arrays 110*a*-110*b*, a control circuit 120 and a charge-transfer circuit 130. The switched-capacitor circuit 100 is configured to adjust differential input voltages VIP and VIN to adjusted voltages VDP and VDN with smaller amplitudes, and configured to amplify the adjusted voltages VDP and VDN to differential output voltages VOP and VON, so as to prevent a post-stage circuit (e.g., a next stage of the pipelined ADC) from a dynamic distortion.

The sampling capacitor array 110*a* is configured to sample an input voltage VIP at an input terminal INP in the sampling phase. In some embodiments, the sampling capacitor array 110*a* comprises capacitors C1-C2, wherein each of first terminals of the capacitors C1-C2 is coupled to the input terminal INP through a switch, and second terminals of the capacitors C1-C2 are coupled to the charge-transfer circuit 130. The sampling capacitor array 110*b* is configured to sample an input voltage VIN at an input terminal INN in the sampling phase. In some embodiments, the sampling capacitor array 110*b* comprises capacitors C3-C4, wherein each of first terminals of the capacitors C3-C4 is coupled to the input terminal INN through a switch, and the second terminals of the capacitors C3-C4 are coupled to the charge-transfer circuit 130.

In some embodiments, the control circuit 120 comprises an ADC 122 and a decoder 124. The ADC 122 is coupled to the input terminals INP and INN, and is configured to generate a digital code Bi according to input voltages VIP and VIN. The decoder 124 is coupled to the ADC 122, and is configured to generate reference voltages VREP and VREN according to the digital code Bi. The reference voltages VREP and VREN are coupled to the sampling capacitor array 110*a* and 110*b*, respectively, to adjust the input voltages VIP and VIN sampled by the sampling capacitor arrays 110*a* and 110*b*, so as to generate the adjusted voltages VDP and VDN. In some embodiments, the decoder 124 comprises an ADC.

The charge-transfer circuit 130 comprises a comparator 132, charge pumps 134*a*-134*b* and feedback paths 136*a*-136*b*. The comparator 132 is configured to compare the adjusted voltages VDP and VDN, so as to generate control signals E1 and E2. The charge pump 134*a* is controlled by a control signal E1, and is configured to generate an output voltage VOP at an output terminal OUP. The charge pump 134*b* is controlled by a control signal E2, and is configured to generate an output voltage VON at an output terminal OUN. More specifically, a first input terminal of the comparator 132 (e.g., a non-inverting input terminal) is coupled to the second terminals of the capacitors C1-C2, so as to receive the adjusted voltage VDP. A second input terminal (e.g., an inverting input terminal) of the comparator 132 is coupled to the second terminals of the capacitors C3-C4, so as to receive the adjusted voltage VDN. The comparator 132 is configured to generate the control signals E1 and E2 according to (by comparing) the adjusted voltages VDP and VDN, so as to use the control signals E1 and E2 to control the charge pumps 134*a*-134*b*, respectively. For example, when the adjusted voltages VDP and VDN are different, the comparator 132 uses the control signals E1 and E2 to enable the charge pumps 134*a*-134*b*. As another example, when the adjusted voltages VDP and VDN are the same, the comparator 132 uses the control signals E1 and E2 to disable the charge pumps 134*a*-134*b*.

The enabled charge pumps 134*a*-134*b* are configured to charge and discharge the output terminals OUP and OUN respectively, so as to generate the output voltages VOP and VON at the output terminals OUP and OUN, respectively.

Figure 2:
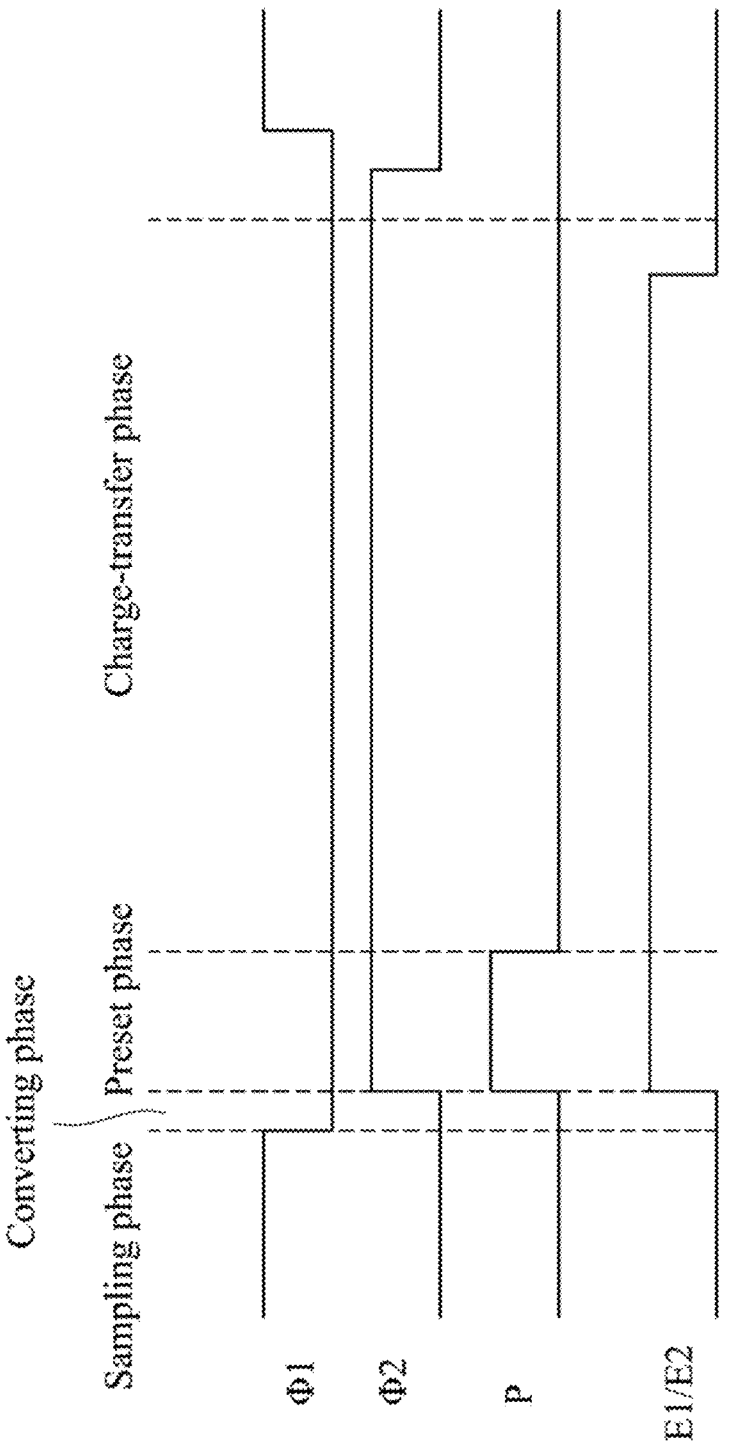
FIG. 2 is a schematic diagram of waveforms of a switched-capacitor circuit according to one embodiment of the present disclosure.

FIG. 2 is a schematic diagram of waveforms of the switched-capacitor circuit 100 according to one embodiment of the present disclosure. In the present disclosure, an enabling level and a disabling level of a signal are configured to conduct and switch off a corresponding switch, respectively. At first, in the sampling phase, a switching signal $\phi$1 is in the enabling level, and a switching signal $\phi$2, a preset signal P and the control signals E1-E2 are in the disabling level. The first terminals of the capacitors C1-C2 are coupled to the input terminal INP to receive (sample) the input voltage VIP. The first terminals of the capacitors C3-C4 are coupled to the input terminal INN to receive (sample) the input voltage VIN. In addition, the second terminals of the capacitors C1-C4, the first input terminal of the comparator 132 and the second input terminal of the comparator 132 all receive a common voltage Vcm.

In the converting phase, the switching signals $\phi$1-$\phi$2, the preset signal P and the control signals E1-E2 are all in the disabling level. The decoder 124 of the control circuit 120 determines magnitude of reference voltages VREP and VREN, and magnitude of preset voltages VN and VP, according to the input voltages VIN and VIP, wherein the preset voltages VN and VP are configured to reset the output terminals OUP and OUN in the following operations.

Figure 3:
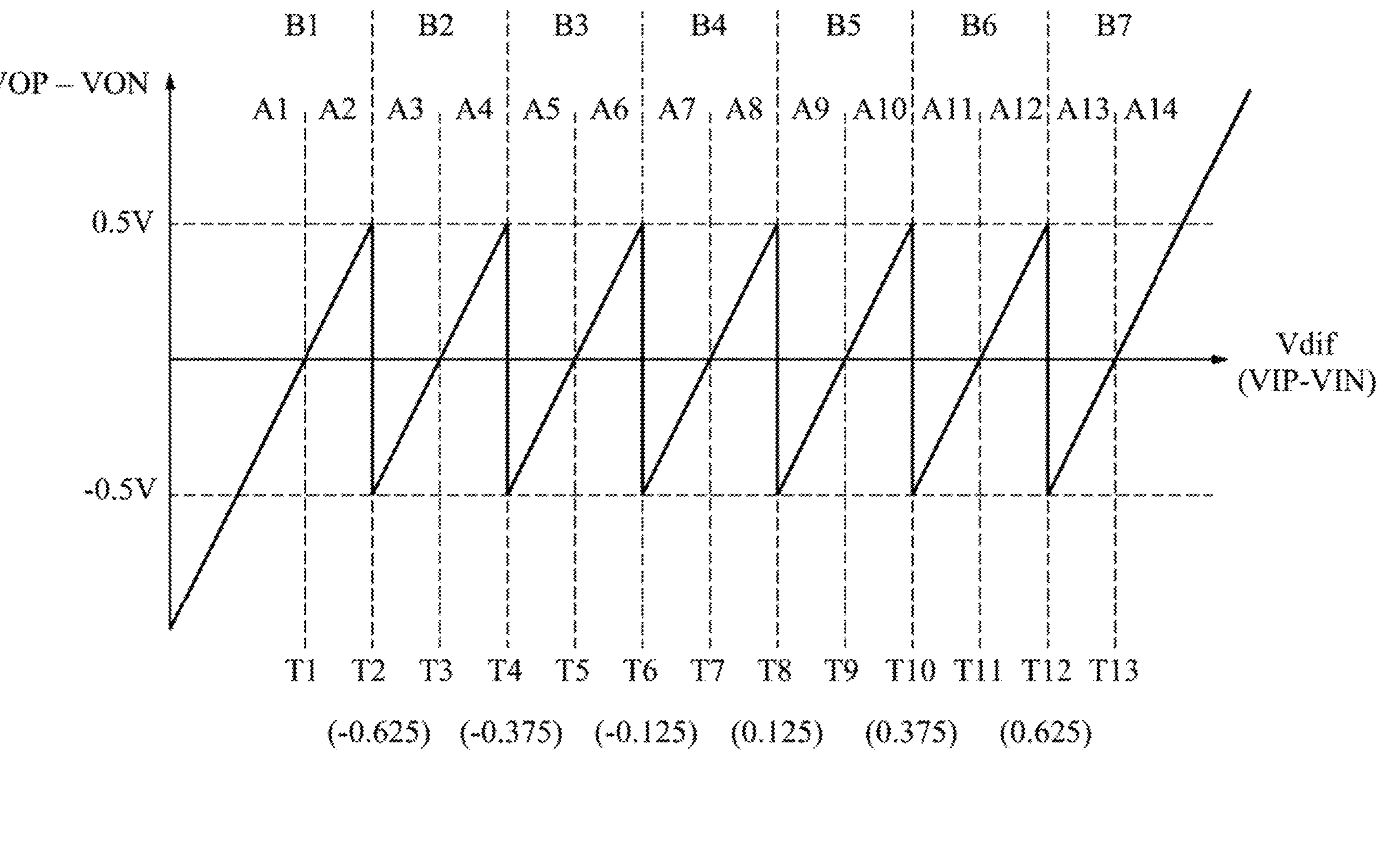
FIG. 3 is a schematic diagram of an input-output characteristic of a switched-capacitor circuit according to one embodiment of the present disclosure.

Referring also to FIG. 3, FIG. 3 is a schematic diagram of an input-output characteristic of the switched-capacitor circuit 100 according to one embodiment of the present disclosure. A vertical axis of FIG. 3 is a difference obtained by subtracting the output voltage VON from the output voltage VOP, and a horizontal axis of FIG. 3 is a difference obtained by subtracting the input voltage VIN from the input voltage VIP (hereinafter referred to as the "input voltage difference Vdif"). In some embodiments, the ADC 122 comprises a plurality of comparators (not depicted), and the plurality of comparators correspond to a plurality of voltage thresholds T1-T13 in FIG. 3, respectively, wherein the voltage thresholds T1-T13 are arranged in ascending order. The voltage thresholds T1-T13 identify a plurality of voltage ranges A1-A14. The number of the voltage thresholds T1-T13 is merely an example, and the present disclosure is not limited thereto.

The ADC 122 is configured to use the plurality of comparators to compare the input voltage difference Vdif with the voltage thresholds T1-T13. Therefore, the ADC 122 can determine the voltage range including the input voltage difference Vdif from the voltage ranges A1-A14, and then output the digital code Bi representing the voltage range. For example, when the input voltage difference Vdif is in the voltage range A1, the digital code Bi that the ADC 122 outputs is 0001; when the input voltage input voltage difference Vdif is in the voltage range A2, the digital code Bi that the ADC 122 outputs is 0010, and so on.

When the input voltage difference Vdif is in a voltage range denoted by an odd number (e.g., the voltage ranges A1, A3, etc.), it means that after the after mentioned charge-transfer phase, the output voltage VOP will be smaller than the output voltage VON. For example, the output voltage VOP is smaller than the common voltage Vcm (e.g., 0.5 V), and the output voltage VON is larger than or equal to the common voltage Vcm. In this situation, according to the digital code Bi, the decoder 124 will set the preset voltage VP to be smaller than the preset voltage VN.

On the other hand, when the input voltage difference Vdif is in a voltage range denoted by an even number (e.g., the voltage ranges A2, A4, etc.), it means that after the after mentioned charge-transfer phase, the output voltage VOP will be larger than the output voltage VON. For example, the output voltage VOP is larger than or equal to the common voltage Vcm, and the output voltage VON is smaller than the common voltage Vcm. In this situation, according to the digital code Bi, the decoder 124 will set the preset voltage VP to be larger than the preset voltage VN.

In other words, when the input voltage difference Vdif is in an M-th voltage range of the voltage ranges A1-A14, the decoder 124 will set the preset voltage VP to be smaller (or larger) than the preset voltage VN. When the input voltage difference Vdif is in an (M+1)-th voltage range of the voltage ranges A1-A14, the decoder 124 will set the preset voltage VP to be larger (or smaller) than the preset voltage VN, wherein M is a positive integer.

In still other words, when the input voltage difference Vdif is adjacent to a J-th voltage threshold of the voltage thresholds T1-T13 (e.g., a first voltage threshold T1), and is smaller than the J-th voltage threshold, the decoder 124 will set the preset voltage VP to be smaller than the preset voltage VN, wherein J is an odd number. When the input voltage difference Vdif is adjacent to the aforementioned J-th voltage threshold, and is larger than or equal to the aforementioned J-th voltage threshold, the decoder 124 will set the preset voltage VP to be larger than the preset voltage VN.

To sum up, according to the digital code Bi, the decoder 124 is configured to determine which voltage range of the voltage ranges A1-A14 the input voltage difference Vdif is in, and determine the magnitude of the preset voltages VN and VP according to the determination result regarding the voltage range. Furthermore, a phase of the preset voltage VN is opposite to a phase of the preset voltage VP; that is, when one is at a high voltage, the other is at a low voltage.

In addition, according to the digital code Bi, the decoder 124 is configured to determine which voltage range of voltage ranges B1-B7 the input voltage difference Vdif is in, and determine the magnitude of the reference voltages VREP and VREN according to the determination result regarding the voltage range. The voltage range B1 is composed of the voltage ranges A1 and A2; the voltage range B2 is composed of the voltage ranges A3 and A4, and so on.

In some embodiments, the relationships between the reference voltages VREP and VREN, the input voltage difference Vdif and the voltage ranges B1-B7 are shown in the following Table 1.

TABLE 1

| Voltage range | Reference voltage VREP | Reference voltage VREN |
|---|---|---|
| B1 | 0 V | 1 V |
| B2 | 0 V | (⅔) V |
| B3 | 0 V | (⅓) V |
| B4 | 0 V | 0 V |
| B5 | (⅓) V | 0 V |
| B6 | (⅔) V | 0 V |
| B7 | 1 V | 0 V |

Then, in the preset phase, the switching signal ϕ2, the preset signal P and the control signals E1-E2 are in the enabling level, and the switching signal ϕ1 is in the disabling level. The control circuit 120 is configured to output the reference voltage VREP correlated to the magnitude of the input voltage VIP to the sampling capacitor array 110*a*, so as to adjust the input voltage VIP sampled by the sampling capacitor array 110*a* according to the magnitude of the input voltage VIP, thereby generating the adjusted voltage VDP. The control circuit 120 is further configured to output the reference voltage VREN correlated to the magnitude of the input voltage VIN to the sampling capacitor array 110*b*, so as to adjust the input voltage VIN sampled by the sampling capacitor array 110*b* according to the magnitude of the input voltage VIN, thereby generating the adjusted voltage VDN.

More specifically, in the preset phase, the comparator 132 along with the output terminals OUP and OUN form a closed loop. The control circuit 120 couples the reference voltages VREP and VREN to a first terminal of the capacitor C2 and a first terminal of the capacitor C4 through the switches, respectively (i.e., couple to the input voltage VIP sampled by the sampling capacitor array 110*a*, and couple to the input voltage VIN sampled by the sampling capacitor array 110*b*). By this, the input voltage VIP sampled by the capacitors C1 and C2 is adjusted to the adjusted voltage VDP, and the input voltage VIN sampled by the capacitors C3 and C4 is adjusted to the adjusted voltage VDN. In addition, in the preset phase, the charge-transfer circuit 130 is configured to transmit the preset voltages VP and VN to the output terminals OUP and OUN, respectively.

In the charge-transfer phase, the switching signal ϕ2 and the control signals E1-E2 are in the enabling level, the switching signal ϕ1 and the preset signal P are in the disabling level. The comparator 132 is configured to compare the adjusted voltages VDP and VDN, and to control the charge pumps 134*a*-134*b* according to the comparing result. As mentioned earlier, when the reference voltages VREP and VREN are different, the comparator 132 will enable the charge pumps 134*a*-134*b*. When the reference voltages VREP and VREN are the same, the comparator 132 will disable the charge pumps 134*a*-134*b*.

It is worth mentioning that, according to the digital code Bi (i.e., according to the input voltages VIP and VIN, or according to the input voltage difference Vdif between the input voltages VIP and VIN), the decoder 124 is configured to set one of the charge pumps 134*a*-134*b* as a current source, and set the other one as a current sink. In one embodiment of the present disclosure, the current source is capable of charge the output terminal to increase the voltage at the output terminal, and the current sink is capable of discharge the output terminal to decrease the voltage at the output terminal. When the preset voltage VP is larger than the preset voltage VN (i.e., when the output voltage VOP is larger than the output voltage VON), the charge pump 134*a* is the current sink and the charge pump 134*b* is the current source. On the other hand, when the preset voltage VP is smaller than the preset voltage VN (i.e., when the output voltage VOP is smaller than the output voltage VON), the charge pump 134*a* is the current source and the charge pump 134*b* is the current sink. Therefore, in the charge-transfer phase, through the cooperation between the comparator 132, the charge pump 134*a* and the charge pump 134*b*, the charge-transfer circuit 130 is configured to amplify the adjusted voltages VDP and VDN, so as to generate the output voltages VOP and VON at the output terminals OUP and OUN, respectively.

To sum up, in the sampling phase, the sampling capacitor arrays 110*a*-110*b* are configured to sample the input voltages VIP and VIN, respectively. In the converting phase, according to the input voltages VIN and VIP (e.g., according to the input voltage difference Vdif between the input voltages VIN and VIP), the control circuit 120 is configured to determine the magnitude of the reference voltage VREP, the reference voltage VREN, the preset voltage VP and the preset voltage VN. More specifically, in the converting phase, according to the relationships between the input voltages VIP and VIN and the voltage thresholds T1-T13 in FIG. 3 (e.g., comparing the input voltage difference Vdif between the input voltages VIN and VIP and the voltage thresholds T1-T13), the control circuit 120 is configured to determine the magnitude of the reference voltage VREP, the reference voltage VREN, the preset voltage VP and the preset voltage VN.

In the preset phase, the control circuit 120 is configured to adjust the input voltage VIP sampled by the sampling capacitor array 110*a* according to the magnitude of the input voltage VIP to generate the adjusted voltage VDP, and configured to adjust the input voltage VIN sampled by the sampling capacitor array 110*b* according to the magnitude of the input voltage VIN to generate the adjusted voltage VDN. More specifically, the control circuit 120 is configured to couple the reference voltage VREP to the input voltage VIP sampled by the sampling capacitor array 110*a* to generate the adjusted voltage VDP, and the control circuit 120 is configured to couple the reference voltage VREN to the input voltage VIN sampled by the sampling capacitor array 110*b* to generate the adjusted voltage VDN.

In addition, in the preset phase, the charge-transfer circuit 130 will provide the preset voltages VP and VN to the output terminals OUP and OUN respectively, wherein a phase of the preset voltage VP is opposite to a phase of the preset voltage VN. The charge-transfer circuit 130 will further amplify the adjusted voltages VDP and VDN in the charge-transfer phase, so as to generate the output voltages VOP and VON at the output terminals OUP and OUN, respectively.

Figure 4:
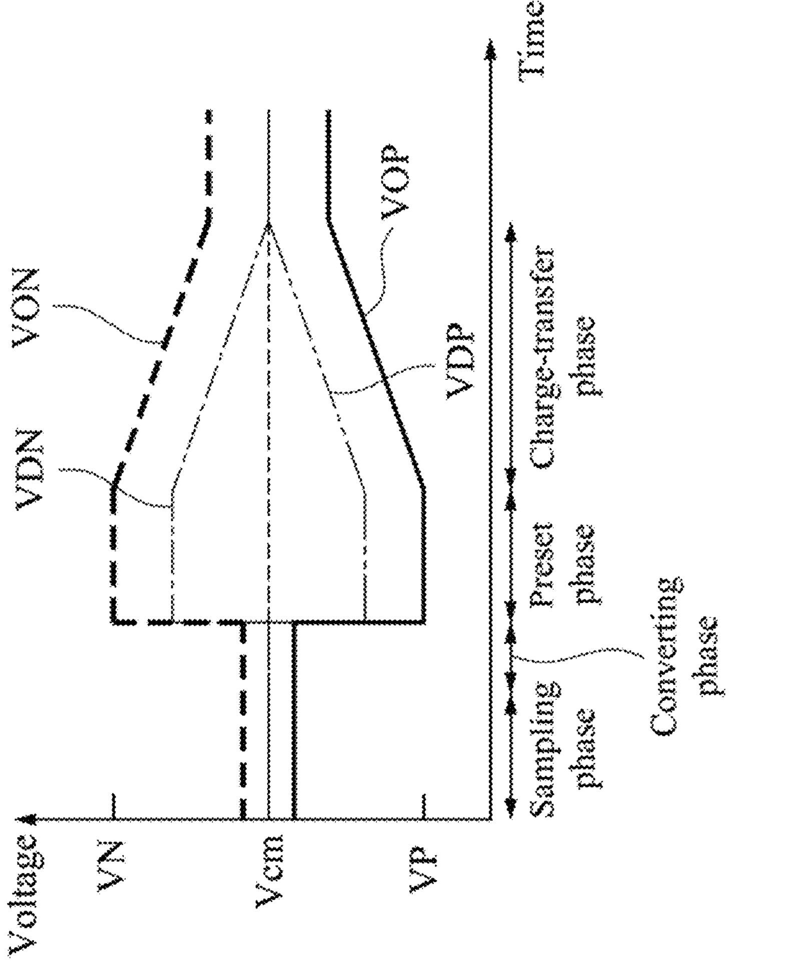
FIG. 4 is a schematic diagram of waveforms of a switched-capacitor circuit according to one embodiment of the present disclosure.

The operation example of the switched-capacitor circuit 100 is illustrated below with FIG. 4. FIG. 4 is a schematic diagram of waveforms of the switched-capacitor circuit 100 according to one embodiment of the present disclosure. In the embodiment of FIG. 4, after the charge-transfer phase, the output voltage VOP will be smaller than the output voltage VON.

In the preset phase, the output terminal OUP (i.e., the output voltage VOP) is set to the lower preset voltage VP (e.g., 0 V), and the output terminal OUN (i.e., the output voltage VON) is set to the higher preset voltage VN (e.g., 1 V), wherein the output voltages VOP and VON are coupled to the adjusted voltages VDP and VDN through the capacitors C1 and C3, respectively. Then, in the charge-transfer phase, the charge pump 134*a* charges the output terminal OUP, and the charge pump 134*b* discharges the output terminal OUN, so as to increase the output voltage VOP and decrease the output voltage VON, until the adjusted voltages VDP and VDN become equal.

It can be seen from the above that the switched-capacitor circuit 100 can determine the voltage range of the output voltages VOP and VON according to its input-output characteristic, and adjust the magnitude of the preset voltages VP and VN correspondingly. Therefore, in the charge-transfer phase, the output voltages VOP and VON can achieve target values rapidly, thereby giving the switched-capacitor circuit 100 a high operating speed.

Figure 5:
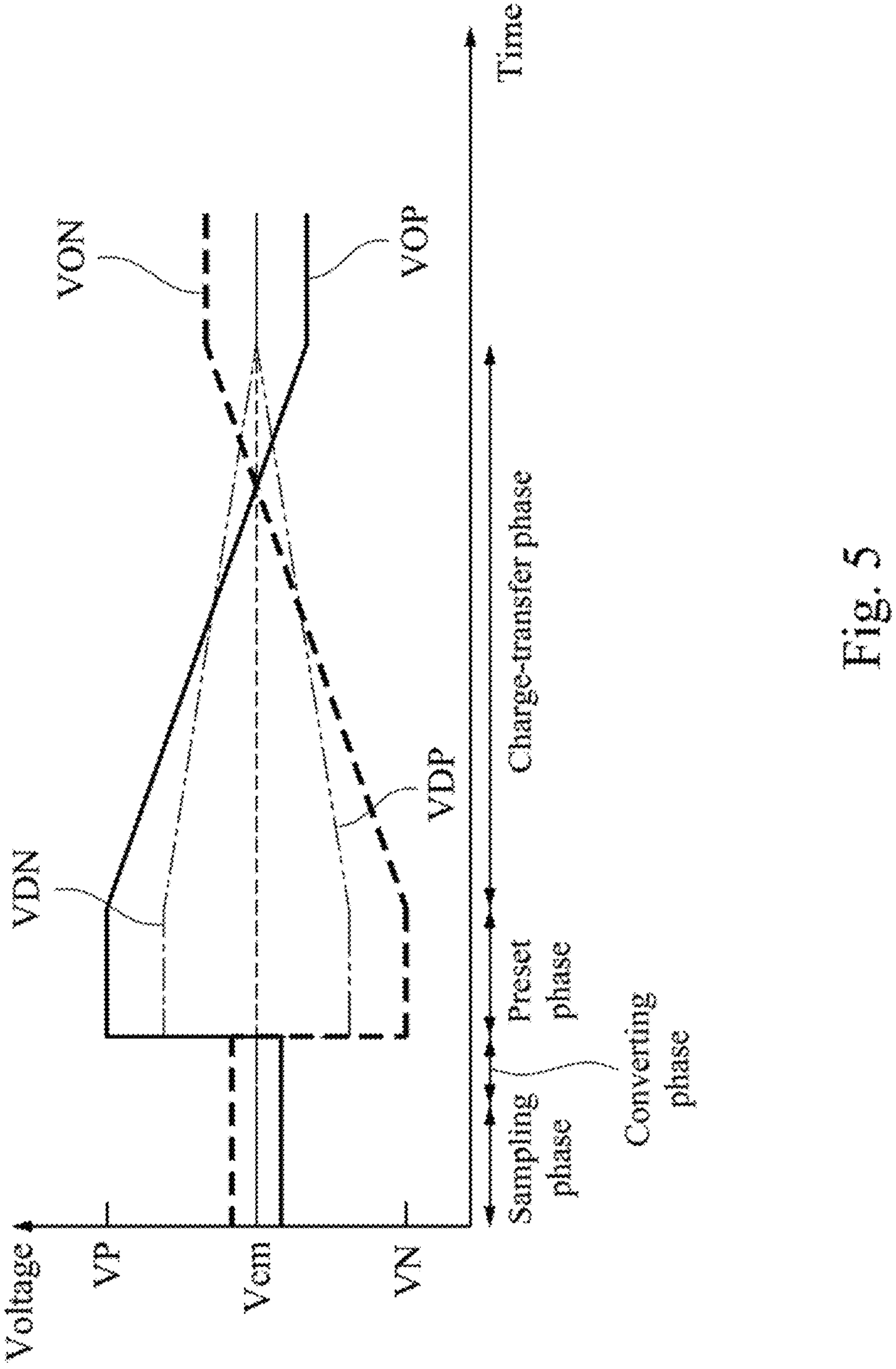
FIG. 5 is a schematic diagram of waveforms of a switched-capacitor circuit according to another embodiment of the present disclosure.

Then, referring to FIG. 5, FIG. 5 is a schematic diagram of waveforms of a switched-capacitor circuit according to another embodiment of the present disclosure. Comparing to the embodiment of FIG. 4, in the embodiment of FIG. 5, after the charge-transfer phase, the output voltage VOP will also be smaller than the output voltage VON, but the preset voltages VP and VN are a fixed high voltage (e.g., 1 V) and a fixed low voltage (e.g., 0 V), respectively. Therefore, the output voltages VOP and VON need a longer time to achieve the target values, and thereby decreasing the operating speed of the switched-capacitor circuit.

Figure 6:
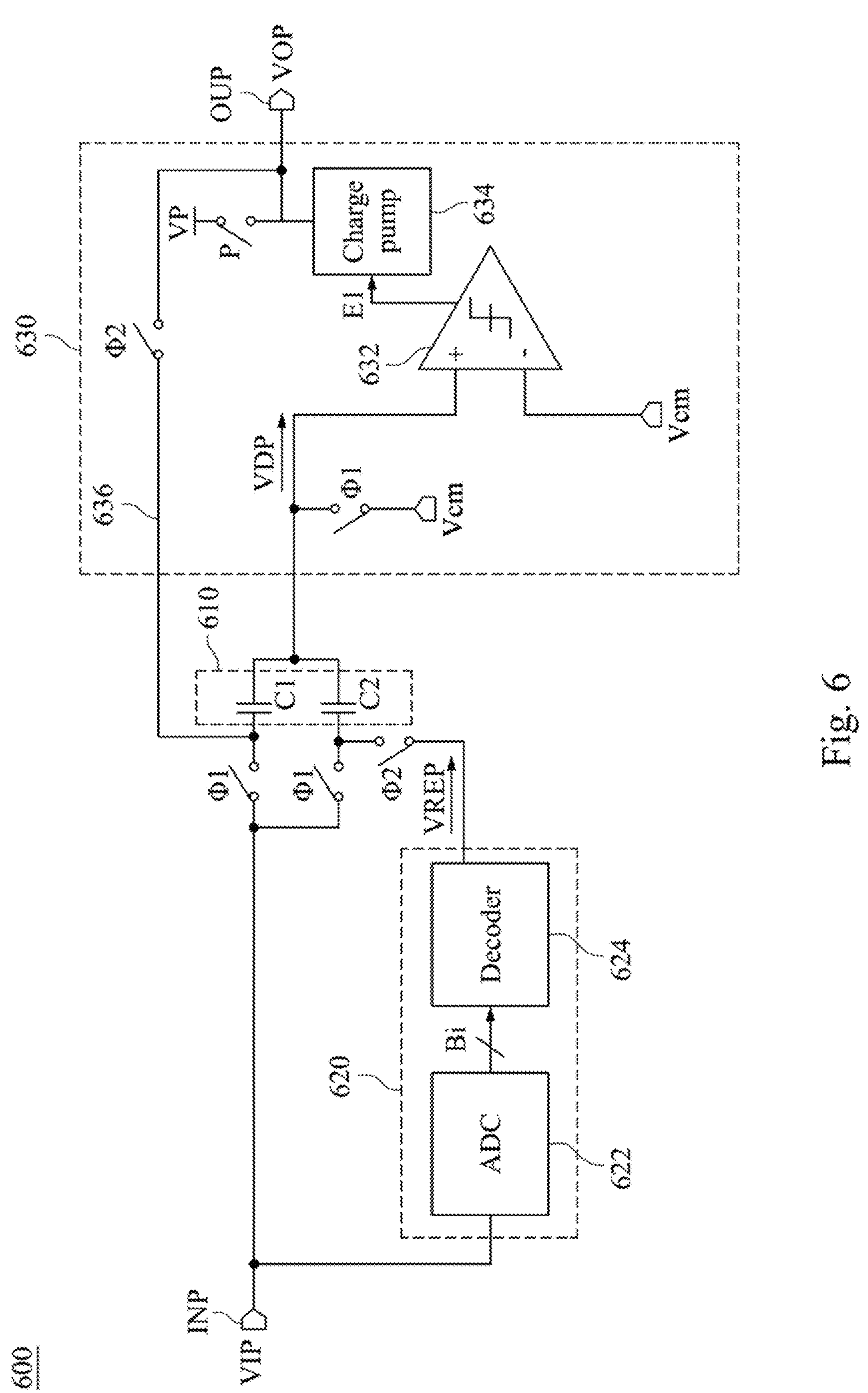
FIG. 6 is a simplified functional diagram of a switched-capacitor circuit according to one embodiment of the present disclosure.

FIG. 6 is a simplified functional diagram of a switched-capacitor circuit 600 according to one embodiment of the present disclosure. The switched-capacitor circuit 600 comprises a sampling capacitor array 610, a control circuit 620 and a charge-transfer circuit 630. The sampling capacitor array 610 is similar to the sampling capacitor array 110*a* in FIG. 1, for simplicity, the detailed descriptions thereof are omitted here. The control circuit 620 comprises an ADC 622 and a decoder 624. The ADC 622 is coupled to the input terminal INP and configured to generate the digital code Bi according to the input voltage VIP. The decoder 624 is coupled to the ADC 622 and configured to generate the reference voltage VREP according to the digital code Bi. The reference voltage VREP is configured to be coupled to the sampling capacitor array 610 to generate the adjusted voltage VDP.

The charge-transfer circuit 630 comprises a comparator 632, a charge pump 634 and a feedback path 636. A first input terminal (e.g., a non-inverting input terminal) of the comparator 632 is coupled to second terminals of the capacitors C1-C2, so as to receive the adjusted voltage VDP. A second input terminal (e.g., an inverting input terminal) of the comparator 632 is configured to receive a common voltage Vcm. The comparator 632 is configured to generate a control signal E1 according to the adjusted voltage VDP and the common voltage Vcm, so as to use the control signal E1 to control the charge pump 634. For example, when the adjusted voltage VDP and the common voltage Vcm are different, the comparator 632 uses the control signal E1 to enable the charge pump 634. As another example, when the adjusted voltage VDP and the common voltage Vom are the same, the comparator 632 uses the control signal E1 to disable the charge pump 634. The feedback path 636 is similar to the feedback path 136*a* in FIG. 1, for simplicity, the detailed descriptions thereof are omitted here.

Figure 7:
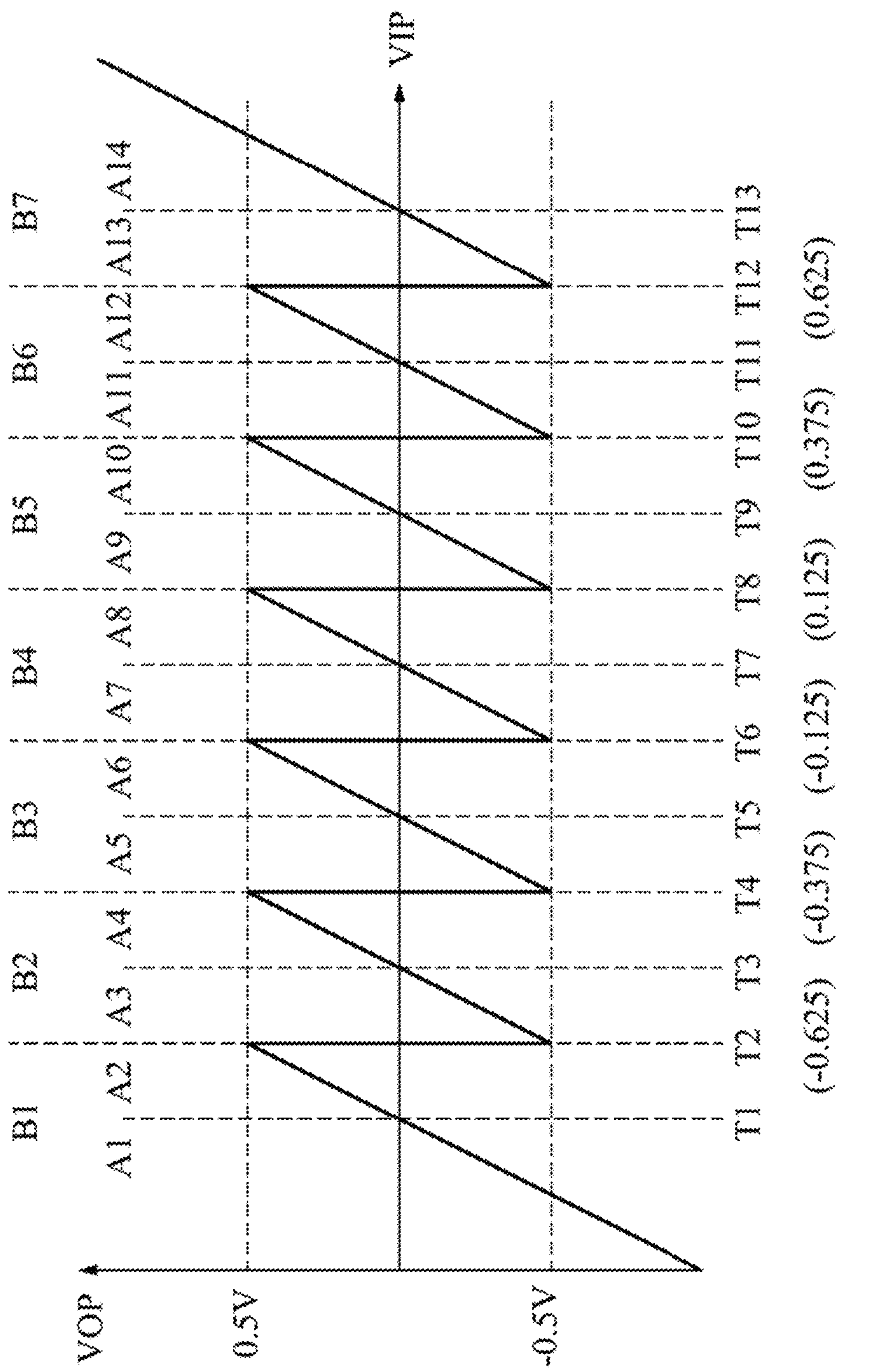
FIG. 7 is a schematic diagram of an input-output characteristic of a switched-capacitor circuit according to one embodiment of the present disclosure.

Referring also to FIG. 7, FIG. 7 is a schematic diagram of an input-output characteristic of the switched-capacitor circuit 600 according to one embodiment of the present disclosure. FIG. 7 is similar to FIG. 3; the difference is that the vertical axis and the horizontal axis of FIG. 7 are the output voltage VOP and the input voltage VIP, respectively. The ADC 622 is configured to use a plurality of comparators to compare the input voltage VIP with the plurality of voltage thresholds T1-T13. By this, the ADC 622 can determine a voltage range including the input voltage VIP from the plurality of voltage ranges A1-A14, and output the digital code Bi representing the voltage range.

The decoder 624 is configured to determine which voltage range of the voltage ranges A1-A14 that the input voltage VIP is in according to the digital code Bi, and determine the magnitude of the preset voltage VP according to the determination result regarding the voltage range. When the input voltage VIP is in a voltage range denoted by an odd number (e.g., the voltage ranges A1, A3, etc.), according to the digital code Bi, decoder 624 will set the preset voltage VP to be smaller than the common voltage Vcm. On the other hand, when the input voltage VIP is in a voltage range denoted by an even number (e.g., the voltage range A2 or A4, etc.), according to the digital code Bi, the decoder 624 will set the preset voltage VP to be larger than the common voltage Vcm.

In other words, when the input voltage VIP is in an M-th voltage range of the voltage ranges A1-A14, the decoder 624 will set the preset voltage VP to be smaller (or larger) than the common voltage Vcm. When the input voltage VIP is in an (M+1)-th voltage range of the voltage ranges A1-A14, the decoder 624 will set preset voltage VP to be larger (or smaller) than the common voltage Vcm, wherein M is a positive integer.

In other words, when the input voltage VIP is adjacent to a J-th voltage threshold of the voltage thresholds T1-T13 (e.g., the first voltage threshold T1), and is smaller than the J-th voltage threshold, the decoder 624 will set the preset voltage VP to be smaller than the common voltage Vom, wherein J is an odd number. When the input voltage VIP is adjacent to the J-th voltage threshold, and is larger than or equal to the J-th voltage threshold, the decoder 624 will set the preset voltage VP to be larger than the common voltage Vcm.

Other operation methods and advantages of the control circuit 620 and the charge-transfer circuit 630 are similar to the control circuit 120 and the charge-transfer circuit 130 in FIG. 1, respectively. For simplicity, the detailed descriptions thereof are omitted here.

Accordingly, in the sampling phase, the sampling capacitor array 610 is configured to sample the input voltage VIP. In the converting phase, the control circuit 620 is configured to determine the magnitude of the preset voltage VP according to the input voltage VIP. For example, in the converting phase, according to the relationships between the input voltage VIP and the voltage thresholds T1-T13 in FIG. 7 (e.g., comparing the input voltage VIP with the voltage thresholds T1-T13), the control circuit 620 is configured to determine the magnitude of the reference voltage VREP and the preset voltage VP.

In the preset phase, according to the magnitude of the input voltage VIP, the control circuit 620 is configured to adjust the input voltage VIP sampled by the sampling capacitor array 610, so as to generate the adjusted voltage VDP. For example, the control circuit 620 is configured to couple the reference voltage VREP to the input voltage VIP sampled by the sampling capacitor array 610, so as to generate the adjusted voltage VDP.

In addition, the charge-transfer circuit 630 will provide the preset voltage VP to the output terminal OUP in the preset phase. The charge-transfer circuit 130 will further amplify the adjusted voltage VDP in the charge-transfer phase, so as to generate the output voltage VOP at the output terminal OUP.

Figure 8:
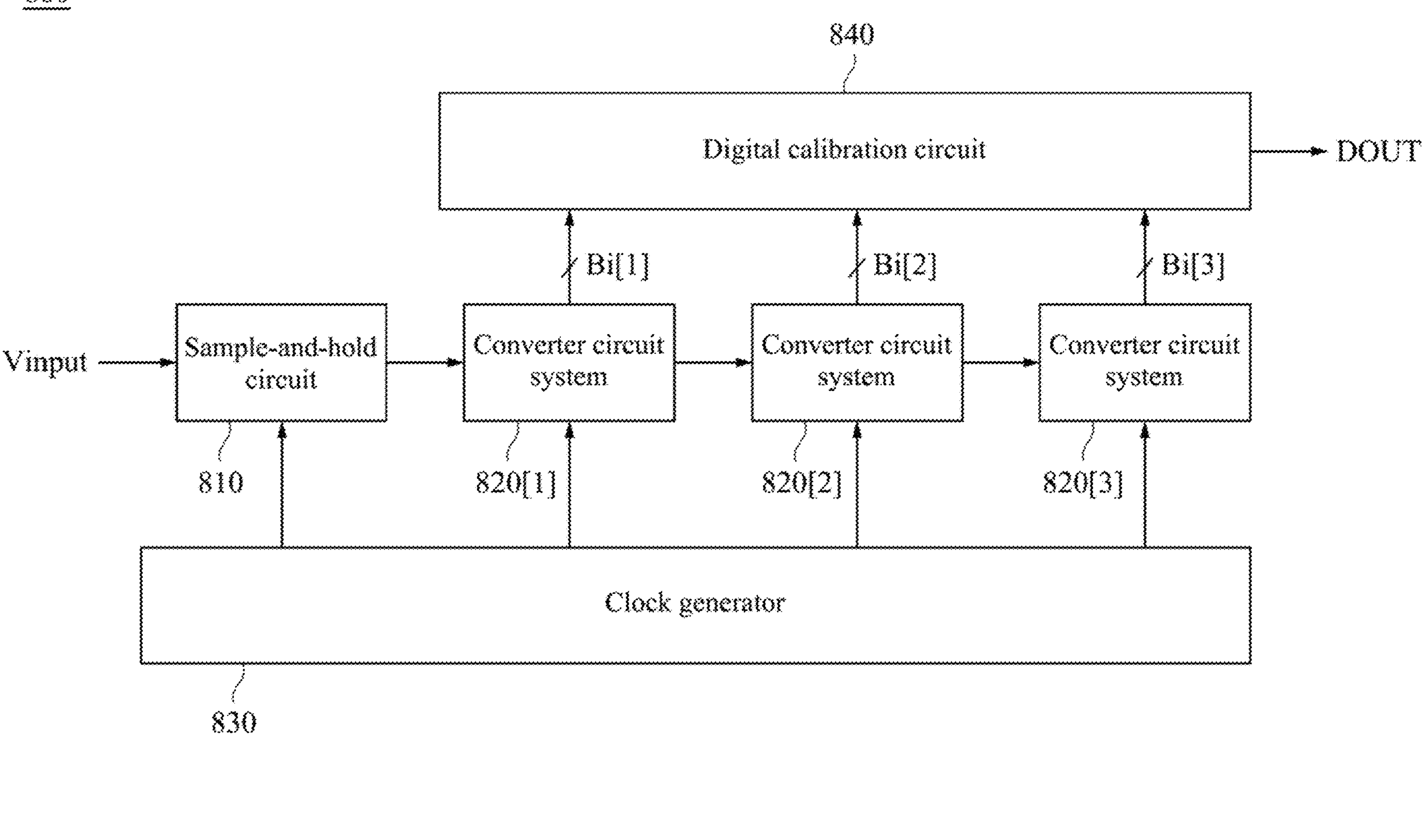
FIG. 8 is a simplified functional diagram of a pipelined ADC according to one embodiment of the present disclosure.

FIG. 8 is a simplified functional diagram of a pipelined ADC 800 according to one embodiment of the present disclosure. The pipelined ADC 800 comprises a sample-and-hold circuit 810, a plurality of converter circuit systems 820[1]-820[3], a clock generator 830 and a digital calibration circuit 840. The sample-and-hold circuit 810 is configured to sample an input signal Vinput.

The converter circuit systems 820[1]-820[3] are configured to are configured to sequentially convert outputs of previous stages to a plurality of digital codes Bi[1]-Bi[3], wherein the converter circuit system 820[1] is configured to convert the sampling result of the sample-and-hold circuit 810 to the input signal Vinput. The number of the converter circuit systems 820[1]-820[3] is merely an example, and the present disclosure is not limited thereto.

The clock generator 830 is configured to generate a plurality of clock signals to the sample-and-hold circuit 810 and the converter circuit systems 820[1]-820[3], so that the sample-and-hold circuit 810 and the converter circuit systems 820[1]-820[3] conduct the aforementioned operations according to the clock signals. The digital calibration circuit 840 is configured to combine the digital codes Bi[1]-Bi[3] to generate a digital code DOUT. In some embodiments, the digital calibration circuit 840 is further configured to calibrate offset errors and/or gain errors of the converter circuit systems 820[1]-820[3].

In some embodiments, each of the the converter circuit systems 820[1]-820[3] can be implemented by the switched-capacitor circuit 100 in FIG. 1. For example, the output voltage of the switched-capacitor circuit 100 can be used as an input voltage of a converter circuit system of the next stage, and the digital code Bi generated by the switched-capacitor circuit 100 can be used as the corresponding one of the digital codes Bi[1]-Bi[3]. In other embodiments, each of the converter circuit systems 820[1]-820[3] can be implemented by the switched-capacitor circuit 600 in FIG. 6. Therefore, the pipelined ADC 800 also has the advantage of high operation speed.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A switched-capacitor circuit, comprising:

a first sampling capacitor array, configured to sample a first input voltage in a sampling phase;

a second sampling capacitor array, configured to sample a second input voltage in the sampling phase;

a control circuit, configured to determine magnitude of a first preset voltage and magnitude of a second preset voltage according to an input voltage difference between the first input voltage and the second input voltage, and configured to adjust the first input voltage sampled by the first sampling capacitor array in a preset phase according to magnitude of the first input voltage, so as to generate a first adjusted voltage, and configured to adjust the second input voltage sampled by the second sampling capacitor array in the preset phase according to magnitude of the second input voltage, so as to generate a second adjusted voltage; and a charge-transfer circuit, configured to amplify the first adjusted voltage in a charge-transfer phase, so as to generate a first output voltage at a first output terminal, and configured to provide the first preset voltage to the first output terminal in the preset phase, and configured to amplify the second adjusted voltage in the charge-transfer phase, so as to generate a second output voltage at a second output terminal, and configured to provide the second preset voltage to the second output terminal in the preset phase, wherein a phase of the first preset voltage is opposite to a phase of the second preset voltage.

2. The switched-capacitor circuit of claim 1, wherein the control circuit comprises:

an analog-to-digital converter (ADC), configured to compare the input voltage difference with a plurality of voltage thresholds to determine a first voltage range including the input voltage difference from a plurality of voltage ranges, and configured to output a first digital code corresponding to the first voltage range, wherein the plurality of voltage ranges are identified by the plurality of voltage thresholds arranged in ascending order; and a decoder, configured to determine the magnitude of the first preset voltage and the magnitude of the second preset voltage according to the first digital code.

3. The switched-capacitor circuit of claim 2, wherein when the input voltage difference is in an M-th voltage range of the plurality of voltage ranges, the decoder is configured to set the first preset voltage to be smaller than the second preset voltage, wherein M is a positive integer; and when the input voltage difference is in an (M+1)-th voltage range of the plurality of voltage ranges, the decoder is configured to set first preset voltage to be larger than the second preset voltage.

4. The switched-capacitor circuit of claim 2, wherein when the input voltage difference is in a P-th voltage range of the plurality of voltage ranges, the decoder is configured to set the first preset voltage to be smaller than the second preset voltage, wherein P is an odd number; and when the input voltage difference is in a Q-th voltage range of the plurality of voltage ranges, the decoder is configured to set the first preset voltage to be larger than the second preset voltage, wherein Q is an even number.

5. The switched-capacitor circuit of claim 1, wherein the charge-transfer circuit comprises:

a comparator, configured to compare the first adjusted voltage with the second adjusted voltage, so as to generate a first control signal and a second control signal;

a first charge pump controlled by the first control signal, configured to generate the first output voltage at the first output terminal; and a second charge pump controlled by the second control signal, configured to generate the second output voltage at the second output terminal, wherein the control circuit is configured to set the first charge pump as one of a current source and a current sink and set the second charge pump as the other one of the current source and the current sink, according to the input voltage difference.

6. A switched-capacitor circuit, comprising:

a first sampling capacitor array, configured to sample a first input voltage in a sampling phase;

a second sampling capacitor array, configured to sample a second input voltage in the sampling phase;

a control circuit, configured to compare an input voltage difference between the first input voltage and the second input voltage with a plurality of voltage thresholds, so as to determine magnitude of a first reference voltage, magnitude of a first preset voltage, magnitude of a second reference voltage and magnitude of a second preset voltage, and configured to couple the first reference voltage to the first input voltage sampled by the first sampling capacitor array in a preset phase, so as to generate a first adjusted voltage, and configured to couple the second reference voltage to the second input voltage sampled by the second sampling capacitor array in the preset phase, so as to generate a second adjusted voltage; and a charge-transfer circuit, configured to amplify the first adjusted voltage in a charge-transfer phase, so as to generate a first output voltage at a first output terminal, and configured provide the first preset voltage to the first output terminal in the preset phase, and configured to amplify the second adjusted voltage in the charge-transfer phase, so as to generate a second output voltage at a second output terminal, and configured to provide the second preset voltage to the second output terminal in the preset phase;

wherein a phase of the first preset voltage is opposite to a phase of the second preset voltage.

7. The switched-capacitor circuit of claim 6, wherein in a case of the plurality of voltage thresholds being arranged in ascending order, when the input voltage difference is adjacent to a J-th voltage threshold of the plurality of voltage thresholds, and is smaller than the J-th voltage threshold, the control circuit is configured to set the first preset voltage to be smaller than the second preset voltage, wherein J is an odd number, in the case of the plurality of voltage thresholds being arranged in the ascending order, when the input voltage is adjacent to the J-th voltage threshold, and is larger than or equal to the J-th voltage threshold, the control circuit is configured to set the first preset voltage to be larger than the second preset voltage.

8. The switched-capacitor circuit of claim 6, wherein the charge-transfer circuit comprises:

a comparator, configured to compare the first adjusted voltage with the second adjusted voltage, so as to generate a first control signal and a second control signal;

a first charge pump controlled by the first control signal, configured to generate the first output voltage at the first output terminal; and a second charge pump controlled by the second control signal, configured to generate the second output voltage at the second output terminal, wherein the control circuit is configured to set the first charge pump as one of a current source and a current sink, and set the second charge pump as the other one of the current source and the current sink, according to the first input voltage and the second input voltage.

9. A pipelined ADC, comprising a plurality of converter circuit systems, wherein each converter circuit system comprises:

a first sampling capacitor array, configured to sample a first input voltage in a sampling phase;

a second sampling capacitor array, configured to sample a second input voltage in the sampling phase;

a control circuit, configured to determine magnitude of a first preset voltage and magnitude of a second preset voltage according to an input voltage difference between the first input voltage and the second input voltage, and configured to adjust the first input voltage sampled by the first sampling capacitor array in a preset phase according to magnitude of the first input voltage, so as to generate a first adjusted voltage, and configured to adjust the second input voltage sampled by the second sampling capacitor array in the preset phase according to magnitude of the second input voltage, so as to generate a second adjusted voltage; and a charge-transfer circuit, configured to amplify the first adjusted voltage in a charge-transfer phase, so as to generate a first output voltage at a first output terminal, and configured to provide the first preset voltage to the first output terminal in the preset phase, and configured to amplify the second adjusted voltage in the charge-transfer phase, so as to generate a second output voltage at a second output terminal, and configured to provide the second preset voltage to the second output terminal in the preset phase;

wherein a phase of the first preset voltage is opposite to a phase of the second preset voltage.

10. The pipelined ADC of claim 9, wherein the control circuit comprises:

an ADC, configured to compare the input voltage difference with a plurality of voltage thresholds, so as to determine a first voltage range including the input voltage difference from a plurality of voltage ranges, and configured to output a first digital code corresponding to the first voltage range, wherein the plurality of voltage ranges are identified by the plurality of voltage thresholds arranged in ascending order; and a decoder, configured to determine the magnitude of the first preset voltage and the magnitude of the second preset voltage according to the first digital code.

11. The pipelined ADC of claim 10, wherein when the input voltage difference is in an M-th voltage range of the plurality of voltage ranges, the decoder is configured to set the first preset voltage to be smaller than the second preset voltage, wherein M is a positive integer, when the input voltage difference is in an (M+1)-th voltage range of the plurality of voltage ranges, the decoder is configured to set the first preset voltage to be larger than the second preset voltage.

12. The pipelined ADC of claim 10, wherein when the input voltage difference is in a P-th voltage range of a plurality of voltage ranges, the decoder is configured to set the first preset voltage to be smaller than the second preset voltage, wherein P is an odd number; and when the input voltage difference is in a Q-th voltage range of the plurality of voltage ranges, the decoder is configured to set the first preset voltage to be larger than the second preset voltage, wherein Q is an even number.

13. The pipelined ADC of claim 9, wherein the charge-transfer circuit comprises:

a comparator, configured to compare the first adjusted voltage with the second adjusted voltage, so as to generate a first control signal and a second control signal;

a first charge pump controlled by the first control signal, configured to generate the first output voltage at the first output terminal; and a second charge pump controlled by the second control signal, configured to generate the second output voltage at the second output terminal, wherein the control circuit is configured to set first charge pump as one of a current source and a current sink, and set the second charge pump as the other one of the current source and the current sink, according to the first input voltage and the second input voltage.

* * * * *